United States Patent [19]

Tonai

[11] Patent Number: 5,047,832
[45] Date of Patent: Sep. 10, 1991

[54] ELECTRODE STRUCTURE FOR III-V COMPOUND SEMICONDUCTOR ELEMENT AND METHOD OF MANUFACTURING THE SAME

[75] Inventor: Ichiro Tonai, Osaka, Japan

[73] Assignee: Sumitomo Electric Industries, Ltd., Japan

[21] Appl. No.: 489,801

[22] Filed: Mar. 8, 1990

[30] Foreign Application Priority Data

Mar. 10, 1989 [JP] Japan .................. 1-59400

[51] Int. Cl.⁵ .............................. H01L 23/48
[52] U.S. Cl. .......................... 357/71; 357/67
[58] Field of Search .................. 357/71, 67

[56] References Cited

U.S. PATENT DOCUMENTS 4,617,192 10/1986 Chin et al. ............... 427/82

FOREIGN PATENT DOCUMENTS 0186460 7/1986 European Pat. Off.
58-48479 3/1983 Japan.
62-155562 10/1987 Japan.

OTHER PUBLICATIONS

E. Kaminska, A. Piotrowska, A. Barcz, J. Adamczewska and A. Turos, "Interaction of Au/Zn/Au Sandwich Contact Layers with $A^{III}B^{V}$ Compound Semiconductors", Solid-State Electronics, vol. 29, No. 3, pp. 279-286, 1986.
8030 Electronics Letters, vol. 18 (1982), May, No. 11, London, Great-Britain (pp. 453 and 454).

Primary Examiner—Eugene R. Laroche
Assistant Examiner—R. Ratliff
Attorney, Agent, or Firm—Beveridge, DeGrandi & Weilacher

[57] ABSTRACT

This invention relates to an electrode structure formed on a p-type III-V compound semiconductor and a method of forming the same. An electrode can by easily formed with a low ohmic contact resistance and formed without degrading a semiconductor element. The electrode structure includes an Au alloy layer formed on a p-type III-V compound semiconductor, a Ti or Cr stopper layer formed on the Au alloy layer, and an Au layer formed on the stopper layer.

25 Claims, 8 Drawing Sheets

P-TYPE III-V COMPOUND SEMICONDUCTOR

P-TYPE III-V COMPOUND SEMICONDUCTOR

P-TYPE III-V COMPOUND SEMICONDUCTOR

ELECTRODE STRUCTURE FOR III-V COMPOUND SEMICONDUCTOR ELEMENT AND METHOD OF MANUFACTURING THE SAME

BACKGROUND OF THE INVENTION

1. Field of the Invention

The present invention relates to an electrode structure formed on a p-type III–V compound semiconductor and a method of manufacturing the same.

2. Related Background Art

A nontoxic AuZn-based metal having a low contact resistance has been conventionally used as an electrode material to form an electrode structure formed on a p-type III–V compound semiconductor. In this case, (1) an AuZn alloy is used as a deposition material; and (2) Au and Zn are deposited independently.

When an AuZn alloy is used, their vapor pressures are different from each other, and it is difficult to control a composition of a metal film deposited on the semiconductor. In this case, adhesion strength between the AuZn alloy and the semiconductor becomes insufficient. In order to solve this problem, a sandwiched structure of Au/Zn/Au (FIG. 1A) is formed to increase the adhesion strength between the alloy and the semiconductor.

Wiring bonding pads are required to connect semiconductor elements and an external circuit by wire bonding. In this case, it is preferable to integrally form the wire bonding pads on an electrode structure so as to reduce stray capacitances of the elements. An electrode structure (FIG. 1B) having a thick AuZn alloy layer having a thickness of 0.5 μm to 2 μm is available as a wire bonding pad (Japanese Patent Laid-Open No. 54-69979).

In order to suppress degradation caused by an irregular alloy reaction occurring during a high-temperature operation of a semiconductor element using Au as an electrode material, Ti and Pt layers are alternately stacked on AuZn, and Au is then formed on the resultant structure, thereby obtaining an electrode structure (FIG. 1C) (Japanese Patent Laid-Open No. 62-155562).

According to a conventional technique shown in FIGS. 1A and 1B, although the stray capacitances of the elements can be reduced, formation of a thick Au wire bonding film on the Au/Zn/Au layer or the AuZn alloy layer causes an alloying reaction between the semiconductor and the thick Au film. As result, element characteristics and wire bonding strength are degraded.

The thickness of the Au layer formed on a semiconductor influences a contact resistance. Taking this influence into consideration, the Au layer is formed to have a minimum thickness (e.g., 10 to 60 nm).

It is conventionally deemed that the thickness of the Au layer formed on the Zn layer or the thickness of the AuZn alloy layer does not influence the contact resistance.

According to the experimental result, however, it was found that the thickness of the Au layer formed on the Zn layer and the thickness of the AuZn alloy layer caused changes in resistance of the electrode layer although this was not taken into consideration in the conventional technique.

FIG. 2 shows an experimental result representing a relationship between the specific contact resistance and the thickness of the Au layer formed on the Zn layer in an electrode having a three-layered (i.e., Au/Zn/Au) structure. According to this experiment, when the thickness of the Au layer is decreased, the resistance is increased.

According to the prior art technique shown in FIG. 1C, degradation of element characteristics caused by an alloying reaction between the semiconductor and the thick Au bonding pad layer can be prevented while a low ohmic contact resistance is assured by AuZn. However, Pt can hardly be selectively etched, and its formation method is limited to a specific one. Since Pt itself is expensive, the manufacturing cost is undesirably high.

SUMMARY OF THE INVENTION

It is an object of the present invention to provide an electrode structure having a low ohmic contact resistance, preventing degradation of characteristics of a semiconductor element, and allowing easy formation of an electrode.

The electrode structure according to the present invention is characterized by comprising an Au alloy layer containing at least one of Zn, Cd, Mg, and Be and formed on a p-type III–V compound semiconductor, a stopper layer consisting of Ti or Cr and formed on the Au alloy layer, and an Au layer formed on the stopper layer.

It is another object of the present invention to provide a method of forming an electrode structure for a III–V compound semiconductor element, comprising: forming a three-layered structure of an Au layer, a layer made of a material selected from the group consisting of Zn, Cd, Mg, and Be, and an Au layer; sequentially forming a stopper layer consisting of Ti or Cr, and an Au layer; and alloying the three-layered structure, the stopper layer, and the Au layer formed on the stopper layer.

Since the electrode structure of the present invention has the structure described above, there is provided an electrode structure having a low ohmic contact resistance and preventing degradation of characteristics of a semiconductor element.

More specifically, after the low ohmic contact is assured by the alloy layer consisting of Au and Zn (or Cd, Mg, and/or Be), the Ti (or Cr) layer is formed on the alloy layer to prevent an alloying reaction between the semiconductor and the thick Au wire bonding layer. For this reason, in a light-receiving element (FIG. 10) having an electrode structure of the present invention, an electrode has a specific contact resistance of about $3 \times 10^{-4} \Omega \cdot cm^2$. In a high-temperature energization test using a biasing voltage of $-15$ V at 200° C., an alloying reaction between the electrode material and the semiconductor does not progress. No element degradation occurs after 2000-hour energization.

Good electrode characteristics can be obtained without using expensive Pt which can hardly be etched, and the manufacturing process can be freely designed to result in low cost.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 3:
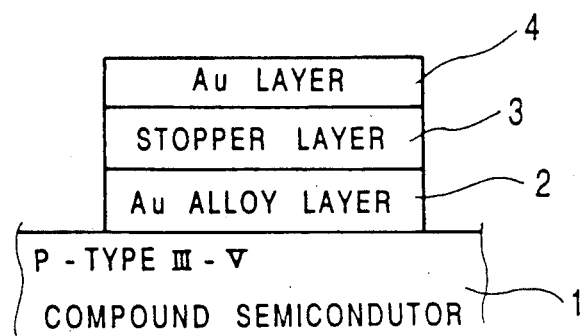
FIG. 3 is a longitudinal sectional view showing an electrode structure when taken along the stacking direction according to the present invention.

FIG. 3 is a sectional view of an electrode structure according to the present invention. An Au alloy layer 2 containing one of Zn, Cd, Mg, and Be is formed on a p-type III–V compound semiconductor 1. A stopper layer 3 is formed on the Au alloy layer 2, and the stopper layer 3 consists of Ti or Cr. An Au layer 4 is formed on the stopper layer 3.

Examples of the p-type III–V compound semiconductor used in the present invention are GaAs, G a P, GaAsP, InSb, GaSb, InP, InGaAsP, and the like.

The thickness of the Au alloy layer 2 containing one of Zn, Cd, Mg, and Be falls within the range of, e.g., 50 to 100 nm. This range need not be limited to a specific one because the range is determined by demanded properties such as a contact resistance and adhesion strength between the alloy layer and the semiconductor.

The thickness of the stopper layer 3 falls within the range of, e.g., 50 nm to 500 nm. The range need not be limited to the specific one because the range is determined in consideration of sufficient prevention of an alloying reaction between the semiconductor 1 and the thick Au layer 4 for wire bonding and electrode patterning. That is, the function of the stopper layer for preventing the alloying reaction in not solely determined depending on the material, i.e., Ti or Cr.

The thickness of the Au layer 4 falls within the range of 0.1 to 1 $\mu$m. Since the electrode structure according to the present invention is formed as described above, Zn, Cd, Mg, or Be is doped in a surface region of the semiconductor from the Au alloy layer formed on the semiconductor, thereby forming a p-type conductive region having a high impurity concentration.

A low ohmic contact resistance is thus assured.

The alloying reaction between the semiconductor and the thick Au layer can be prevented by the stopper layer consisting of Ti or Cr and formed between the semiconductor and the thick Au bonding pad layer. For this reason, the semiconductor element is not degraded.

According to the present invention, in addition, since Ti or Cr is used to form the stopper layer 3, the stopper layer can be easily etched by, e.g., a buffered hydrofluoric acid. A lift-off method and local etching can be used at the time of formation of an electrode pattern. Thus, the electrode formation process can be freely designed, the electrode can be easily manufactured.

Figure 1A:
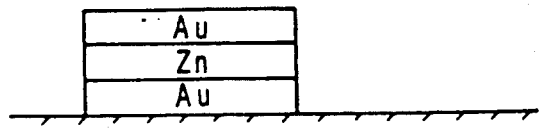
FIGS. 1A, 1B, and 1C are longitudinal sectional views showing electrode structures according to conventional techniques, respectively.
Figure 1B:
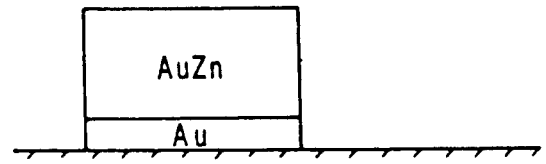
Figure 1C:
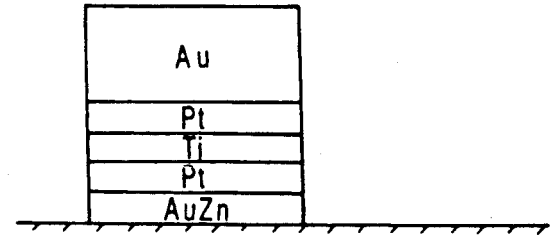
Figure 2:
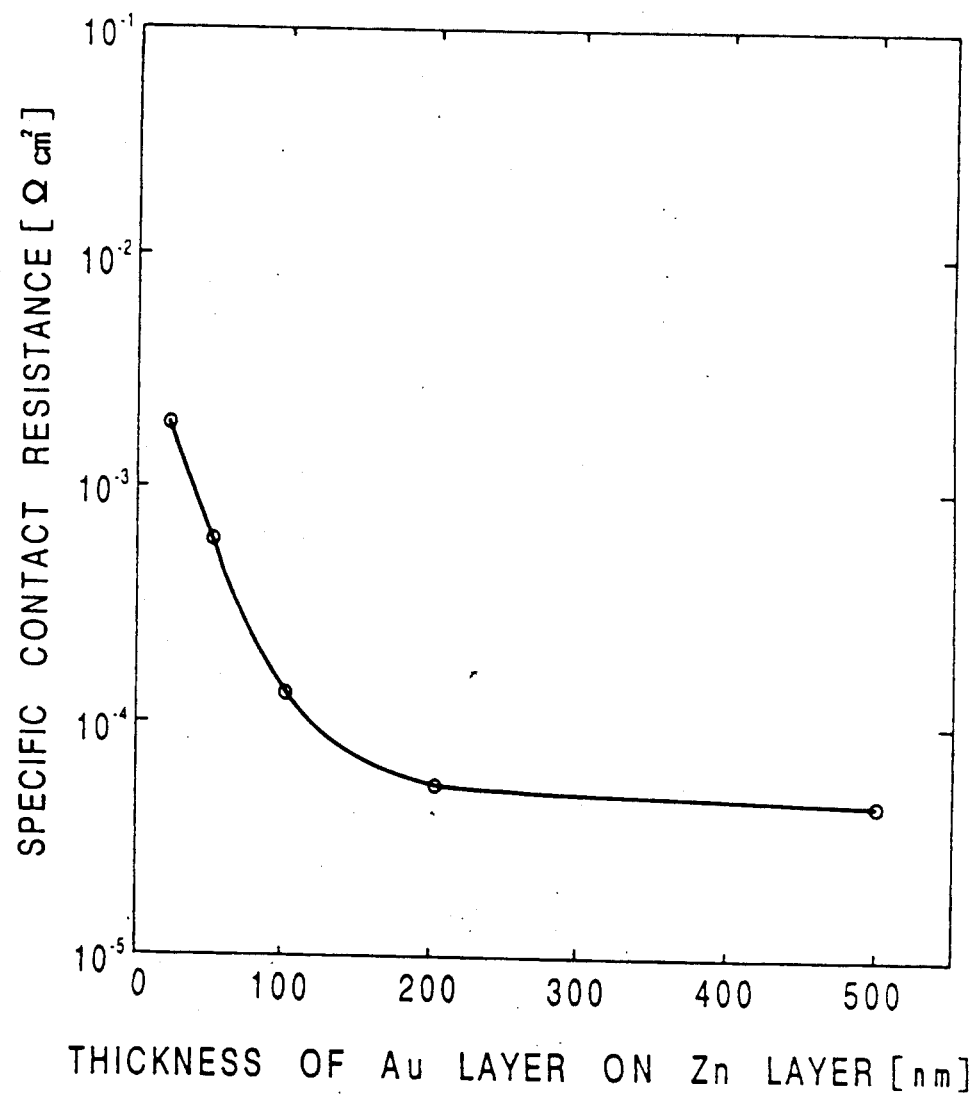
FIG. 2 is a graph showing a relationship between the specific contact resistance and the thickness of the Au layer.

To the contrary, since Pt used in the conventional technique in FIG. 1C can hardly be etched, a Pt pattern formation method is limited to the lift-off method.

Figure 4:
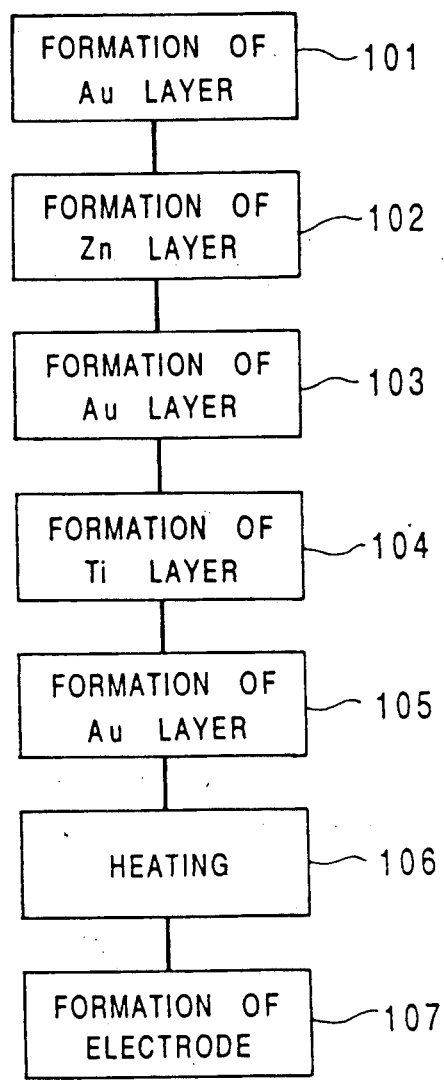
FIG. 4 shows steps in forming an electrode according to an embodiment of the present invention.
Figure 5:
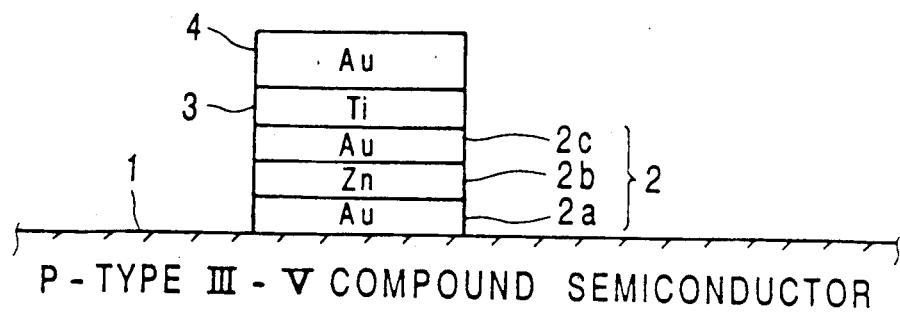
FIG. 5 is a longitudinal sectional view showing a structure prior to heating (step 106) shown in FIG. 4.

A method of forming the electrode described above will be described with reference to FIGS. 4 and 5. FIG. 4 shows steps in forming the electrode, and FIG. 5 is a longitudinal sectional view prior to alloying (heating). In step 101, e.g., a 60-nm thick Au layer 2a is formed on a III–V compound semiconductor 1 by a thermal evaporation from a source heated resistively. In step 102, e.g., a 20-nm thick Zn layer 2b is formed on the Au layer 2a by the thermal evaporation from a source heated resistively. In step 103, e.g., a 90-nm thick Au layer 2c is formed on the Zn layer 2b by the thermal evaporation from a source heated resistively. The Au layer 2a, the Zn layer 2b, and the Au layer 2c constitute the Au alloy layer 2. In step 104, e.g., a 100-nm thick Ti layer 3 is formed on the Au layer 2c by a thermal evaporation from a source heated by an electron beam. In step 105, e.g., a 400-nm thick Au layer 4 is formed on the Ti layer 3 by the thermal evaporation from a source heated resistively. In step 106, the entire structure is heated at an alloying temperature of 450° C. to form an electrode.

The thicknesses of the Au layer 2a, the Zn layer 2b, and the Au layer 2c formed prior to formation of the AuZn layer 2 in the above electrode formation method are defined as follows.

The thickness of the Au layer 2a falls within the range of, e.g., 10 nm to 120 nm and is not limited to a specific value since the thickness is determined in accordance with the demanded properties such as a contact resistance and adhesion strength between the semiconductor and the Au layer 2a.

As this thickness is decreased (e.g., less than 10 nm), the contact resistance tends to be increased, and the adhesion strength between the Zn layer 2b and the semiconductor device tends to be decreased. As the thickness is increased (e.g., exceeding 100 nm), a diffusion concentration of Zn in the semiconductor tends to be decreased. As a result, the contact resistance is increased. The thickness of the Au layer 2a preferably falls within the range of 10 nm to 100 nm.

The thickness of the Zn layer 2b falls within the range of, e.g., 7 nm to 60 nm but is not limited to a specific value because the thickness is determined by the contact resistance and the adhesion strength between the Zn layer 2b and the Au layer 2a and between the Zn layer 2b and the Au layer 2c.

As the thickness is decreased (e.g., less than 10 nm), the contact resistance tends to be increased, and as the thickness is increased the adhesion strength between the Zn layer 2b and the Au layer 2a and between the Zn layer 2b and the Au layer 2c tends to be decreased. Therefore, the thickness preferably falls within the range of 10 nm to 50 nm.

The thickness of the Au layer 2c falls within the range of, e.g., 40 nm to 350 nm but need not be limited to a specific value because the thickness is determined by the required contact resistance and reliability of a semiconductor element.

As the thickness of the Au layer 2c is decreased (e.g., less than 50 nm), the contact resistance tends to be increased. As the thickness of the Au layer 2c is increased (e.g., exceeding 300 nm), reliability of the semiconductor element tends to be degraded. Therefore, the thickness of the Au layer 2c preferably falls within the range of 50 nm to 300 nm.

The above layers exhibit effects such as low contact resistances and high adhesion strength with adjacent layers when their thickness fall within the corresponding ranges.

EXAMPLE 1

Figure 6:
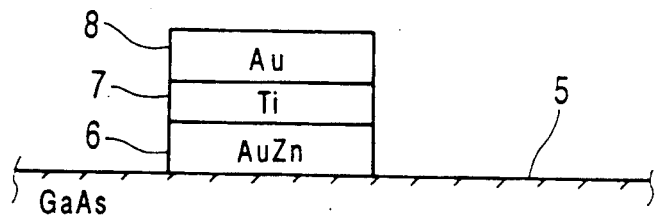
FIG. 6 is a longitudinal sectional view showing an electrode structure in Example 1 according to the present invention when taken along the stacking direction.

FIG. 6 is a longitudinal sectional view showing an electrode structure in Example 1.

A GaAs semiconductor 5 was used as a III–V compound semiconductor. A 60-nm thick Au layer, a 20-nm thick Zn layer, and a 90-nm thick Au layer were sequentially formed on the GaAs semiconductor 5 by the thermal evaporation from a source heated resistively.

Conditions in the thermal evaporation from a source heated resistively were as follows. A heating temperature of a boat at the formation of the Au layer was about 1,000° C. and at the formation of the Zn layer was 100° to 400° C. A vacuum pressure was about $1 \times 10^{-6}$ Torr.

When formation of the Au layer on the Zn layer was completed, a 100-nm thick Ti layer 7 was formed on the Au layer formed on the Zn layer by the thermal evaporation from a source heated by the electron beam. At this time, deposition conditions were as follows. An electron beam acceleration voltage was 10 KV, and a vacuum pressure was $1 \times 10^{-6}$ Torr.

A 400-nm thick Au layer 8 was formed on the Ti layer 7 by the thermal evaporation from a source heated resistively.

The resultant structure was then etched by using as iodine solution or buffered hydrofluoric acid, thereby forming an electrode pattern. The electrode pattern was alloyed at an alloying temperature of 450° C. for 4 minutes to form an electrode on the surface of the semiconductor. A contact resistance of the electrode was measured to be $3 \times 10^{-4}$ $\Omega \cdot cm^2$. Even if the electrode was heated at 200° C. for 168 hours, no diffusion of Au into the semiconductor was found.

EXAMPLE 2

Figure 7:
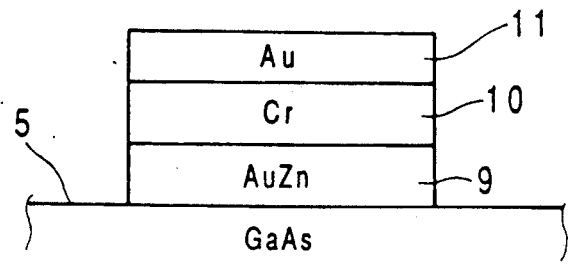
FIG. 7 is a longitudinal sectional view showing an electrode structure in Example 2 according to the present invention when taken along the stacking direction.

FIG. 7 is a longitudinal sectional view showing an electrode structure in Example 2.

Following the same procedures as in Example 1, a 90-nm thick Cr layer 10 was formed in place of the Ti layer 7 in Example 1 by thermal evaporation from a source heated by an electron beam. An acceleration voltage was 10 KV, and a vacuum pressure was $1 \times 10^{-6}$ Torr. The method and conditions for forming other layers are the same as those in Example 1. An electrode pattern was formed by a lift-off method. After the respective layers were formed, the resultant structure was heated at 450° C. for 4 minutes to obtain a multilayered structure on which an AuZn layer 9, a Cr layer 10, and an Au layer 11 were sequentially formed on the semiconductor surface.

The specific contact resistance of the electrode was about $10^{-4} \Omega \cdot cm^2$, and no degradation was found (as in the conditions of Example 1).

EXAMPLE 3

Figure 8:
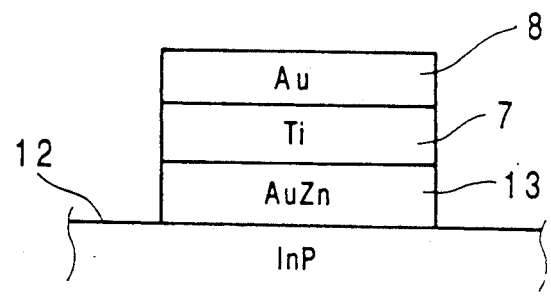
FIG. 8 is a longitudinal sectional view showing an electrode structure in Example 3 according to the present invention when taken along the stacking direction.

FIG. 8 is a longitudinal sectional view showing an electrode structure in Example 3.

An InP semiconductor 12 was used as a III–V compound semiconductor. A 15-nm thick Au layer, a 20-nm thick Zn layer, and a 60-nm thick Au later were formed on the InP semiconductor 12. A stopper layer, an Au layer, and deposition conditions were given as in Example 1.

EXAMPLE 4

Figure 9:
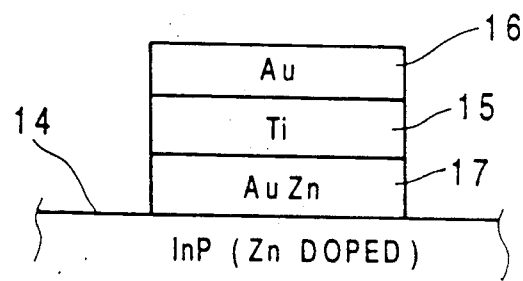
FIG. 9 is a longitudinal sectional view showing an electrode structure in Example 4 according to the present invention when taken along the stacking direction.

FIG. 9 is a longitudinal sectional view showing an electrode structure in Example 4.

A Zn-doped InP semiconductor 14 was used as a p-type III–V semiconductor. Following the same procedures as in Example 1, an Au layer, a Zn layer, an Au layer, a Ti layer 15, and an Au layer 16 were sequentially formed on the semiconductor to obtain a multilayered structure. An electrode pattern was formed by a lift-off method.

The electrode pattern was then heated in alloying conditions (temperature: 450° C.; time: 4 minutes) to alloy the Au layer, the Zn layer, and the Au layer, thereby forming an AuZn alloy layer 17.

The contact resistance of the electrode was $3 \times 10^{-4} \Omega \cdot cm^2$, which satisfied all the required properties.

Following the same procedures as in Example 4, electrode patterns were formed by using Mg and Be in place of the Zn layer. The properties of these electrode patterns did not pose any practical problems.

EXAMPLE 5

Figure 10:
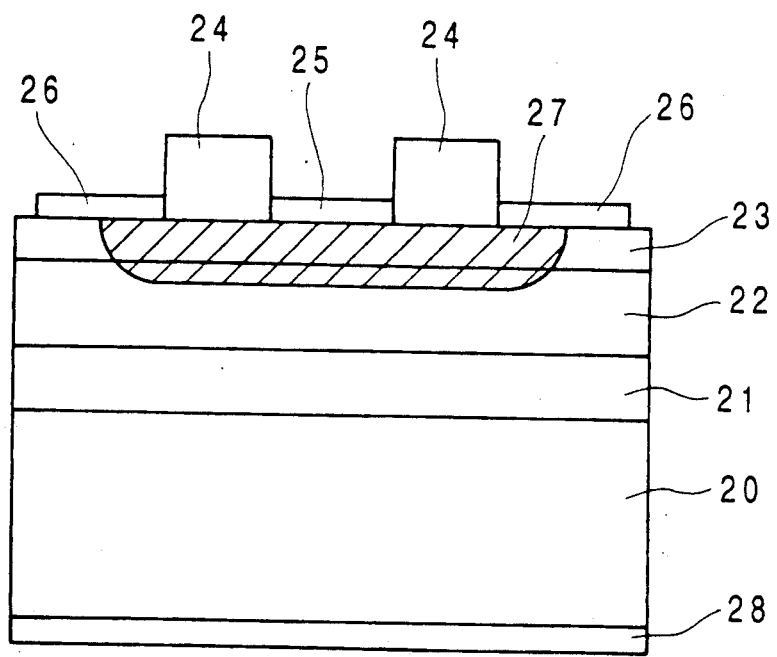
FIG. 10 is a longitudinal sectional view showing an electrode structure in Example 5 according to the present invention when taken along the stacking direction.

Example 5 shows an application in which the electrode structure of the present invention is applied to a light-receiving element. FIG. 10 is a longitudinal sectional view of a light-receiving element containing the electrode structure in Example 5. In a semiconductor element having the electrode of Example 5, a buffer layer 21 consisting of $n^-$-type InP, a light-receiving layer 22 consisting of $n^-$-type InGaAs, and a window layer 23 consisting of $n^-$-type InP are formed on a semiconductor substrate 20 consisting of $n^+$-type InP. A p-type conductive region 27 is formed in a predetermined area in this layer by Zn diffusion. A pair of p-side electrodes 24 of the present invention are formed on the p-type conductive region 27. An n-side electrode 28 is formed on the lower surface of the semiconductor substrate 20. An antireflection film 25 is formed inside the p-side electrodes 24. Passivation films 26 are formed outside the p-side electrodes 24. The p-side electrode 24 is formed such that an Au/Zn/Au Ti/Au multilayered structure is alloyed by the method described above (FIG. 4). The specific contact resistance of this electrode structure was about $3 \times 10^{-4} \Omega \cdot cm^2$, which was almost equal to a low ohmic contact resistance of the conventional AuZn-based electrode structure. In this case, a wire bonding strength was 4 g when 20-μm diameter Au wire was used.

Figure 11:
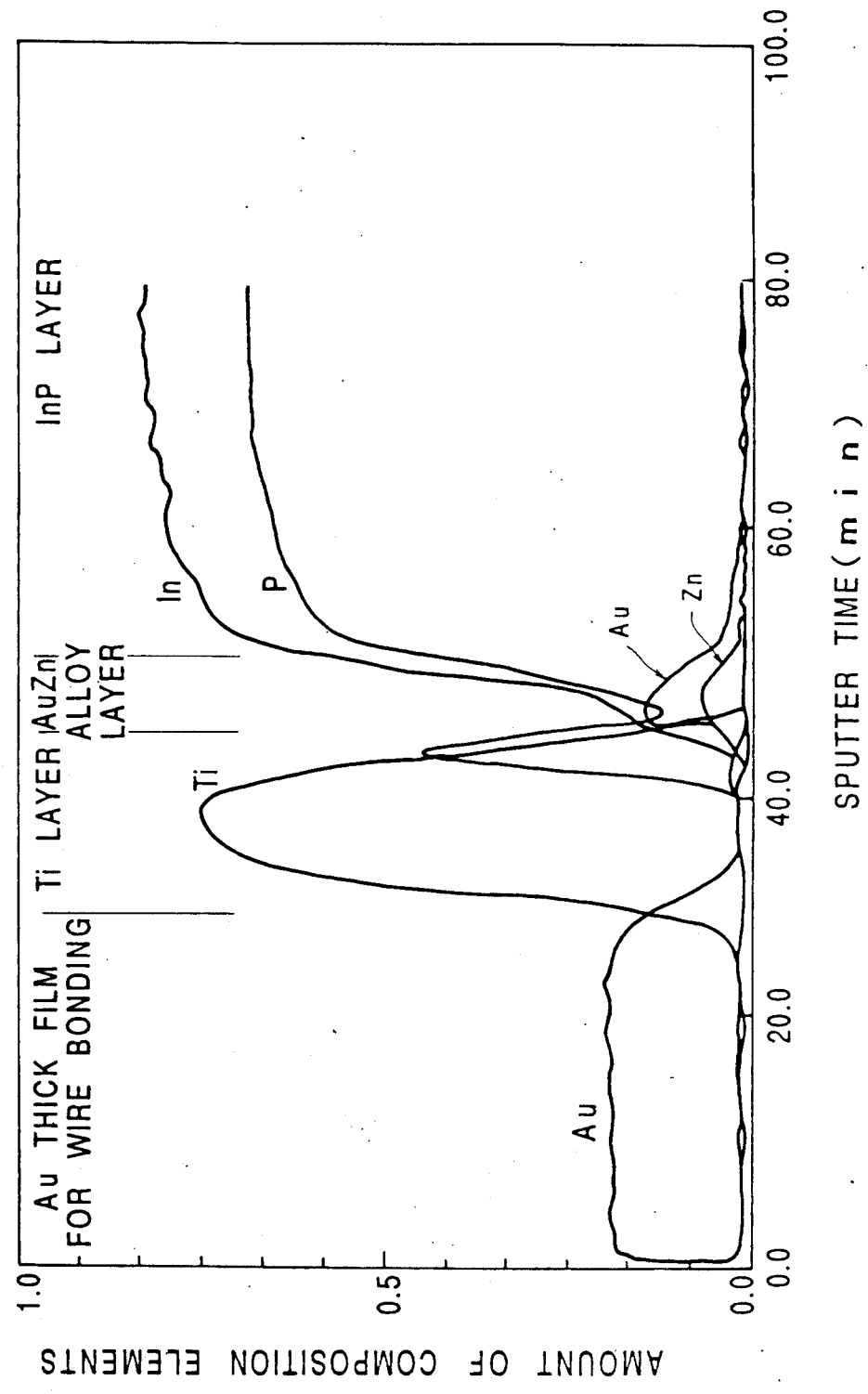
FIG. 11 is a graph showing a composition analysis result in a direction of depth of the electrode shown in FIG. 10 by $\mu$-AES.

FIG. 11 shows a composition analysis result of the electrode in direction of its depth μ-AES. Since the Ti layer is used, the alloying reaction between the thick Au film and the InP compound semiconductor is apparently prevented.

The present invention is not limited to the particular embodiment described above. InP is used as the III-V compound semiconductor. However, GaP, GaAsP, GaAs, or the like may be used in place of InP.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. An electrode structure for a p-type III-V compound semiconductor element, comprising:
    an Au alloy layer formed on a p-type III-V compound semiconductor, said Au alloy layer containing at least one of Zn, Cd, Mg, and Be in addition to Au,
    a stopper layer formed directly onto said Au alloy layer, said stopper layer consisting essentially of Ti or Cr, and
    an Au layer formed directly onto said stopper layer.

2. A structure according to claim 1, wherein said p-type III-V compound semiconductor essentially consists of GaAs.

3. A structures according to claim 1, wherein said p-type III-V compound semiconductor essentially consists of Zn-doped InP.

4. A structure according to claim 1, wherein said Au alloy layer essentially consists of an alloy of Au and Zn.

5. A structure according to claim 1, wherein said stopper layer essentially consists of Ti.

6. An electrode structure according to claim 1, wherein said stopper layer is Cr.

7. An electrode structure according to claim 1, wherein said stopper layer is Ti.

8. An electrode structure according to claim 1, wherein the thickness of the Au alloy layer is from 50 to 100 nm.

9. An electrode structure according to claim 1, wherein the thickness of the Au layer is from 0.1 to 1 micrometers.

10. An electrode sructure according to claim 1, wherein the thickness of the Au layer is from 0.1 to 1 micrometers.

11. An electrode structure for a p-type III-V compound semiconductor element, comprising:
    an Au-Zn alloy formed on a p-type III-V compound semiconductor;
    a stopper layer formed directly onto said Au-Zn alloy, said stopper layer consisting essentially of Ti; and
    an Au layer formed directly onto said stopper layer.

12. An electrode structure according to claim 11, wherein said p-type III-V compound semiconductor is GaAs.

13. An electrode structure according to claim 11, wherein said p-type III-V compound semiconductor is Zn-doped InP.

14. An electrode structure according to claim 11, wherein said p-type III-V compound semiconductor is GaP.

15. An electrode structure according to claim 11, wherein said p-type III-V compound semiconductor is GaAsP.

16. An electrode structure according to claim 11, wherein said p-type III-V compound semiconductor is InSb.

17. An electrode structure according to claim 11, wherein said p-type III-V compound semiconductor is GaSb.

18. An electrode structure according to claim 11, wherein said p-type III-V compound semiconductor is InGaAsP.

19. An electrode structure for a p-type III-V compound semiconductor element, comprising:
    an Au alloy layer formed on a p-type III-V compound semiconductor, said Au alloy layer being formed by providing an Au layer directly on said p-type III-V compound semiconductor, providing a Zn layer on the Au layer, providing another Au layer on the Zn layer and conducting an annealing treatment;
    a stopper layer formed directly onto said Au alloy layer, said stopper layer consisting essentially of Ti or Cr; and
    an Au layer formed directly onto said stopper layer.

20. An electrode structure according to claim 19, wherein the stopper layer is Ti.

21. A platinum-free electrode structure for a p-type III-V compound semiconductor element, comprising:
    an Au alloy layer formed on a p-type III-V compound semiconductor, said Au alloy layer containing at least one of Zn, Cd, Mg, and Be in addition to Au;
    a stopper layer formed on said Au alloy layer, said stopper layer consisting essentially of Ti or Cr; and
    an Au layer formed on said stopper layer.

22. A platinum-free electrode structure according to claim 21, wherein said stopper layer is Cr.

23. A platinum-free electrode structure according to claim 21, wherein said stopper layer is Ti.

24. A platinum-free electrode structure according to claim 21, wherein Au is alloyed with Zn in the Au alloy layer.

25. A platinum-free electrode structure according to claim 23, wherein Au is alloyed with Zn in the Au alloy layer.

* * * * *